United States Patent [19]

Kumar

[11] Patent Number: 5,317,006
[45] Date of Patent: May 31, 1994

[54] CYLINDRICAL MAGNETRON SPUTTERING SYSTEM

[75] Inventor: Nalin Kumar, Austin, Tex.

[73] Assignee: Microelectronics and Computer Technology Corporation, Austin, Tex.

[21] Appl. No.: 771,353

[22] Filed: Oct. 4, 1991

Related U.S. Application Data

[63] Continuation of Ser. No. 495,385, Mar. 16, 1990, abandoned, which is a continuation-in-part of Ser. No. 366,853, Jun. 15, 1989, abandoned.

[51] Int. Cl.⁵ .................. H01L 39/00; C23C 14/35; C23C 14/56
[52] U.S. Cl. ................. 204/298.12; 204/192.24; 204/298.21; 204/298.24; 204/298.26; 505/731; 505/816; 505/950; 505/475
[58] Field of Search ............ 204/192.24, 298.12, 204/298.13, 298.23, 298.24, 298.21, 298.26; 505/1, 731, 816

[56] References Cited

U.S. PATENT DOCUMENTS 4,842,704  6/1989  Collins et al. ............... 204/192.24
5,047,394  9/1991  Wolfe et al. .................... 505/1

FOREIGN PATENT DOCUMENTS

290127  11/1988  European Pat. Off. ....... 204/298.24

*Primary Examiner*—Aaron Weisstuch
*Attorney, Agent, or Firm*—Johnson & Gibbs

[57] ABSTRACT

An improved cathode for a sputtering system includes a metal cylinder and strips of material bonded to the inside of the metal cylinder and/or material sprayed onto the inside of the metal cylinder. The strips may have various specified compositions and/or configurations and/or other characteristics which enhance the ability of the sputtering system to deposit films of high temperature superconductor material on substrates.

12 Claims, 7 Drawing Sheets

CYLINDRICAL MAGNETRON SPUTTERING SYSTEM

CROSS-REFERENCE TO RELATED APPLICATION

This is a continuation, of application Ser. No. 07/495,385, filed Mar. 16, 1990, now abandoned, which is a continuation-in-part of application Ser. No. 07/366,853, filed Jun. 15, 1989, now abandoned. This application is filed by the same inventor named in parent application Ser. No. 07/366,853. Both this application and its parent are presently co-pending.

BACKGROUND OF THE INVENTION

1. Field of the Invention

This invention relates to a cylindrical magnetron sputtering system and, more particularly, to a cylindrical hollow cathode magnetron sputtering system for depositing a film or films on cylindrical substrates.

2. Description of Related Art

Thin layers of conducting materials such as metals, metal silicides, or low-resistivity polycrystalline silicon; and insulating substances such as silicon dioxide, silicon nitride, and phosphosilicate glass constitute important elements of many semiconductor devices.

Various techniques have been developed to cause such layers to be established as part of a device. One such technique, known as film deposition, involves supplying component materials for a growing layer from external sources and depositing those materials down upon a substrate. Such deposition processes are generally carried out in a vapor phase within a reduced pressure atmosphere of a selected gas or gases, or in a vacuum. If the material to be deposited does not react chemically during deposition, the process is referred to as Physical Vapor Deposition or PVD. If, on the other hand, the deposited material is a product of a chemical reaction which occurs within the vapor phase, either on the surface or in the vicinity of the substrate, the process is known as Chemical Vapor Deposition or CVD. Hybrid methods of film deposition, i.e., those which involve both physical and chemical processes, are also known.

One method of physically depositing a film upon a substrate is known as sputtering. A typical sputtering system includes a target (a cathode) and a substrate holder (an anode) positioned so that the surface of a substrate upon which the film to be deposited, which substrate is placed on the holder, faces the target. The target is a plate of the material to be deposited or from which a film is to be synthesized. The target is connected to a negative voltage supply, either dc or rf, and the substrate holder may be either grounded, floating, or biased, as well as either heated, cooled, or some combination thereof. A gas, at a pressure from a few millitorr to about 100 mTorr, is introduced into a chamber containing the substrate holder and target to provide a medium in which a glow discharge plasma can be initiated and maintained. When the glow discharge is started, positive ions strike the target and stimulate the removal of mainly neutral target atoms therefrom by momentum transfer. These atoms then condense into a thin film formed upon the surface of the substrate placed on the substrate holder. In addition, various particles other than neutral atoms, e.g., electrons and ions, are also produced at the target which may have a significant effect on the properties of the film deposited on the substrate.

Examining the sputtering process in more detail, a low pressure abnormal negative glow plasma discharge is maintained within the chamber between the cathode (target) and the anode (substrate holder). Electrons emitted from the cathode due to ion bombardment thereof are accelerated to near the full applied potential within the cathode dark space, i.e., a relatively nonluminous region between the cathode and the negative glow. Such high energy electrons enter the negative glow as so-called primary electrons where they collide with gas atoms and produce the ions required to sustain the plasma discharge. The primary electron mean free path increases with both increasing electron energy and decreasing pressure within the chamber. At low pressures, ions are produced far from the cathode where their chances of being lost are great. Additionally, many primary electrons hit the anode with high energies, causing a loss that is not offset by impact-induced secondary emission. Thus, ionization efficiencies are low. As the pressure within the sputtering chamber is increased at a fixed voltage, the primary electron mean free path decreases and larger currents are possible; however, at high pressures within the chamber the sputtered atom transport which occurs has been found to be reduced by collisional scattering.

It has also been found that a magnetic field extending parallel to the cathode surface can restrain primary electron motion to regions in the vicinity of the cathode and thereby increase ionization efficiency. It has been further found that the E×B electron drift currents can be caused to close on themselves by the use of cylindrical cathodes, which thereby prevent the E×B motion from causing the plasma discharge to be swept to one side. Based upon the foregoing, various cylindrical magnetron systems have been developed. Such systems having cylindrical, hollow cathodes are known as inverted magnetrons or cylindrical hollow magnetrons A typical cylindrical hollow magnetron sputtering system includes one or more solenoids, wound on a core of magnetic material, and placed coaxially and externally to or within the cathode to serve as a field generator. Typically, the anodes are also joined to tubular backstrap and are both made from magnetic material. The aforementioned anode design effectively reduces field curvature near the ends of the anode and also increases the magnetic field strength in the plasma located inside the cathode. Where a plurality of solenoids are used, current ratios of those solenoids may be controlled to provide a variety of field shapes. To avoid changes caused by unequal heating of the solenoids, they are also typically connected in series with one another.

Heretofore, cylindrical hollow magnetron systems have been recognized as useful for coating substrates of complex shapes where: (a) the hollow cathode has a uniform wall erosion rate; (b) the substrate surface is far enough from the ends so that end losses can be ignored; and (c) the object to be coated has an unobstructed view of the cathode surface. Thus, heretofore, the usefulness of cylindrical hollow magnetron sputtering systems has been viewed as involving positioning the anode where end losses may be ignored and positioning the object to be coated so that it is always completely exposed to the cathode surface.

The deposition of thin film coatings onto cylindrical substrates such as wires and fibers, which have not been recognized as having complex shapes, has heretofore involved either rotation of the substrate while moving it relative to a uni-directional coating material source, such as a planar diode, or other steps wholly unrelated to the processes described herein. Needless to say, those prior processes which involve rotating a wire or fiber being coated with a thin film require the use of complex rotating means. Even using the most precise rotating systems now available cannot ensure a film of sufficient uniformity of thickness and quality for a number of currently developing applications. For example, it is becoming highly desirable to be able to deposit films of a few microns in thickness upon optical fibers, ceramic fibers, thin wires and other such cylindrical substrates. Certain new applications require the deposit of one or more films of metallic, superconducting, dielectric, electro-optic, magnetic and/or piezoelectric materials onto the surface of fibers and wires in highly precise and uniform layers.

In addition to the problems of film thickness and uniformity discussed above, the prior art methods of film deposition include a number of other shortcomings which render them inefficient in coating cylindrical substrates. For example, it has been found that using a planar magnetron sputtering system to apply relatively thick films over very large lengths of fibers is extremely inefficient because of the inherently low cathode material utilization characteristic of such systems when thin fibers are used as substrates.

The method and system of the present invention overcomes many of the disadvantages of prior art sputtering systems when the substrates to which a film is to be applied are wires and fibers.

SUMMARY OF THE INVENTION

The present invention provides a film deposition apparatus and method especially suitable for depositing a film or films on generally cylindrical substrates. Broadly, the present invention provides a film deposition system including a sputtering system and means for moving or causing the substrate to move through that sputtering system. The present invention encompasses combinations of sputtering systems connected in series for successively depositing a plurality of films on a particular substrate caused to pass through the entire series of film deposition systems. The present invention also includes novel structural features within various components of the overall system, which novel structural features have desirable effects upon the performance of the overall system according to the present invention. For example, in certain embodiments the sputtering system includes a cylindrical cathode surrounded by donut type magnets of alternating polarity which serve to create a magnetic field configuration resulting in plasma confinement over a large range of plasma densities This is a preferred configuration where a very long hollow cathode is used to increase the throughput of the system, i.e., length of substrate which can be coated in a given period of time.

Accordingly, it is an object of the present invention to provide a system for producing radially, axially and circumferentially uniform coatings on cylindrical substrates, such as wires and fibers.

Another object of the present invention is to provide a film deposition system for fibers that can deposit coating materials at low fiber temperatures.

Yet another object of the present invention is to provide a fiber deposition coating system having a high deposition rate.

Still yet another object of the present invention is to provide a fiber deposition coating system wherein film properties may be precisely controlled.

A further object of the present invention is to provide a fiber deposition coating system which may be readily and easily incorporated into an automatic coating process.

BRIEF DESCRIPTION OF THE DRAWINGS

Other objects, advantages and novel features of the present invention will become apparent from the following detailed description of the invention when considered in conjunction with the accompanying drawings wherein.

DESCRIPTION OF THE PREFERRED EMBODIMENTS

Figure 1:
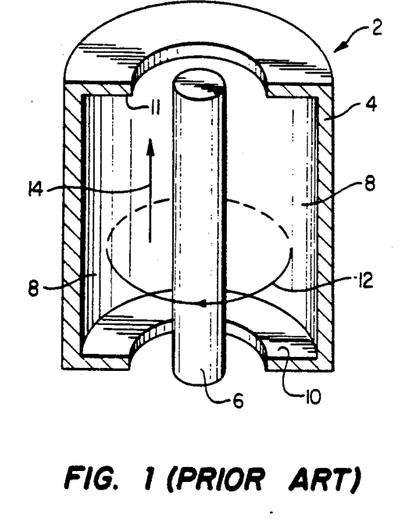
FIG. 1 is a cross-sectional perspective view of a prior art cylindrical hollow magnetron.
Figure 2:
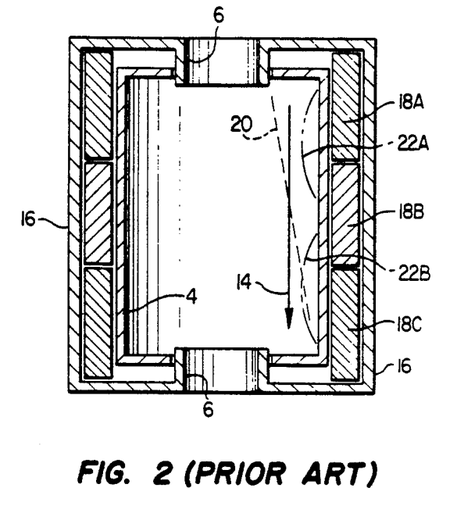
FIG. 2 is a cross-sectional, schematic view of a prior art cylindrical hollow magnetron sputtering source.

Referring now to the drawings wherein like reference numerals designate the same or similar elements throughout the several views, FIGS. 1 and 2 show prior art cylindrical hollow magnetron sputtering systems, variations of which, described further below, form a part of a film deposition system according to the present invention. More specifically, FIG. 1 shows a cylindrical hollow magnetron, generally designated by reference numeral 2, as described in the Description of Related Art section above. Magnetron 2 may be seen to comprise a cathode 4 and an anode 6. A plasma sheet, commonly formed in an atmosphere of argon gas surrounding the magnetron 2, is indicated by shade lines 8. Circular end members 10 and 11 are electron reflecting surfaces formed of materials well known to those skilled in the art. Arrow 12 indicates the direction of E×B electron motion and arrow 14 indicates the direction of the magnetic field.

Referring now to FIG. 2, there is shown in greater detail a typical prior art cylindrical hollow magnetron sputtering source. This source also illustrates design features discussed in the Description of Related Art section above. For example, the anodes 6 are shown jointed to a tubular backstrap 16 which is formed of magnetic material to reduce field curvature near the ends of the cylindrical space and to increase the field strength in the plasma inside the cathode 4. Additionally, between the cathode 4 and the tubular backstrap 16 is disposed a solenoid 18 which is divided into a plurality of coils, three of which 18A, 18B, 18C are shown in FIG. 2. As discussed above, the ratios of the different currents within the coils 18A, 18B, 18C are often controlled to provide a variety of magnetic field shapes including wedges and double traps, as illustrated by magnetic field lines 20 and 22A, 22B respectively.

Figure 3:
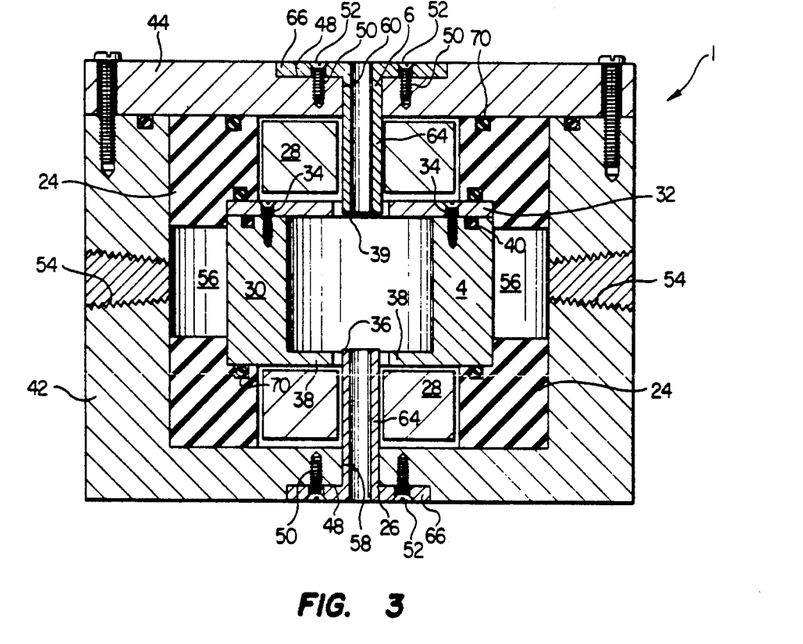
FIG. 3 is a cross-sectional view of a sputtering system according to the teachings of the present invention.

FIG. 3 is a cross-sectional view, not necessarily to scale (as are none of the Figs.), of a cylindrical hollow magnetron sputtering system 1 for use according to the teachings of the present invention. This system 1, like the prior art system shown in FIG. 2, includes a cathode 4 and two anodes 6. Additionally, this system 1 includes two electric insulators 24, an especially modified backstrap 42, and two ring-shaped permanent magnets 28. Details regarding each of the elements forming the embodiment of FIG. 3 are set forth below.

Cathode 4 comprises a container element 30, top 32, and means 34 for connecting top 32 to container element 30. This latter means is shown as a plurality of screws 34 driven through an equal number of holes through the top 32 into corresponding tapped holes in the container element 30. Of course, other means for connecting top 32 to container element 30 may be employed. For example, top 32 and container element 30 may be provided with engaging threads or interlocking slots and notches. It is within the scope of the present invention to employ any conventional connecting means to connect top 32 to container element 30.

The precise dimensions of the various elements of FIG. 3 are not limited to any particular range. However, because a system according to the present invention has actually been constructed and operated and found to be extremely effective in coating thin cylindrical substrates, the approximate dimensions of the embodiment of the system actually constructed are set forth herein so that those skilled in the art may more readily construct a preferred embodiment of the invention for coating thin cylindrical substrates. Referring again to FIG. 3, it may be seen that the container element 30 has an inner cylindrical diameter, an outer cylindrical diameter, a height, and a bore hole diameter (which bore hole is formed axially through the bottom center of the container element 30). In the embodiment of the present invention actually constructed, the bore hole diameter is about one-half inch, the inner cylindrical diameter is about one and one-quarter inch, the outer cylindrical diameter is about two and one-half inches, and the height of container element 30 is about one and three-eighths inch. The top 32, which needs to be only slightly larger than the major opening of the container element 30, has a diameter in the actually constructed embodiment which is about equal to the outer cylindrical diameter of container element 30, that is, two and one-half inches. The top 32 is about one-eighth inch thick, as is the bottom portion 38 of the container element 30. The top 32, like the container element 30, also has a central axial hole 39 extending therethrough which is about one-half inch in diameter. Other dimensions, such as thread size and depth of the tapped holes and the width and depth of the 0-ring channel 40 are much less significant and are not set forth herein. In the actually constructed embodiment, both the top 32 and the container element 30 were formed of copper by conventional techniques; however, all such conventional construction techniques and alternative cathode materials, well known to those skilled in the art, should be considered to be within the scope of the present invention.

Surrounding the cathode 4 is an interconnectible structure comprising anodes 6, a magnetic backing plate 42 and a magnetic backing plate top 44. Although plate 42 and top 44 are somewhat similar to container element 30 and top 32 (e.g., the two groups both comprise a receptacle-like element and a closure-like element), there are a number of significant structural differences between them. First, the bottom of plate 42 and the top of top 44 are adapted to receive the anodes 6. In FIG. 3 this adaption may be seen to include having indented portions 48 and tapped holes 50 to receive screws 52 that pass through certain portions of the anodes 6. Additionally, container element 42 has a number of side openings 54 (two are shown in FIG. 3) to allow coolant to be pumped into the inner chamber 56, to allow coolant to leave inner chamber 56, and to allow an electrical connection to be made to cathode 6. Further details about these openings 54 are discussed below in connection with FIG. 14. Also, it is important to note that magnetic stainless steel is a preferred material for use in forming (by conventional means) plate 42 and top 44, although other suitable materials, well known to those skilled in the art, may be employed. Significant dimensions of the actually constructed plate 42 are: an outer diameter of about five inches, an inner diameter of about three and one-half inches, a height of about three and one-half inches, and a bottom thickness of about one-half inch. The top 44 has an overall diameter of about five inches and a thickness of about one-half inch. Central holes 58 and 60 that pass through container element 42 and top 40, respectively, have diameters of about one-half inch. Holes 58 and 60 are aligned with holes 36 and 39 respectively in the container 30 and the top 32.

The anodes 6 are suitably formed of either copper or aluminum and have barrel portions 64 and flange portions 66. Barrel portions 64 of the two anodes 6 pass through aligned holes 58 and 36, and 60 and 39, respectively. Flange portions 66 of the anodes 6 are adapted to be received into the indentions 48 and are connected to either top 44 or plate 42 by connecting means such as screws 50. In the actually constructed embodiment of anodes 6, barrel portions 64 are about one and one-quarter inch long and flange portions 66 are about one-eighth inch thick.

The system shown in FIG. 3 also includes two generally ring-shaped electric insulators 24 (although only one such insulator could be required in certain embodiments of the present invention). Electric insulators 24 are sized and shaped so as to be snugly disposed within the enclosure formed by elements 42 and 40 when joined and, at the same time, to snugly hold cathode 4. It may also be noted that electric insulators 24 each have slots 70 adapted to receive O-rings for sealing purposes. Electric insulators 24 may be formed of Teflon, a ceramic or any number of other materials known to those skilled in the art by any number of known, conventional techniques.

Finally, it is important to note that both the embodiment of the system of the present invention that was actually constructed and the one shown in FIG. 3 include permanent magnets 28. These magnets are used to confine and enhance the plasma within the cathode 4. While two ring-shaped magnets are shown in FIG. 3, other permutations and arrangements of permanent magnets will be discussed in detail below.

Figure 4:
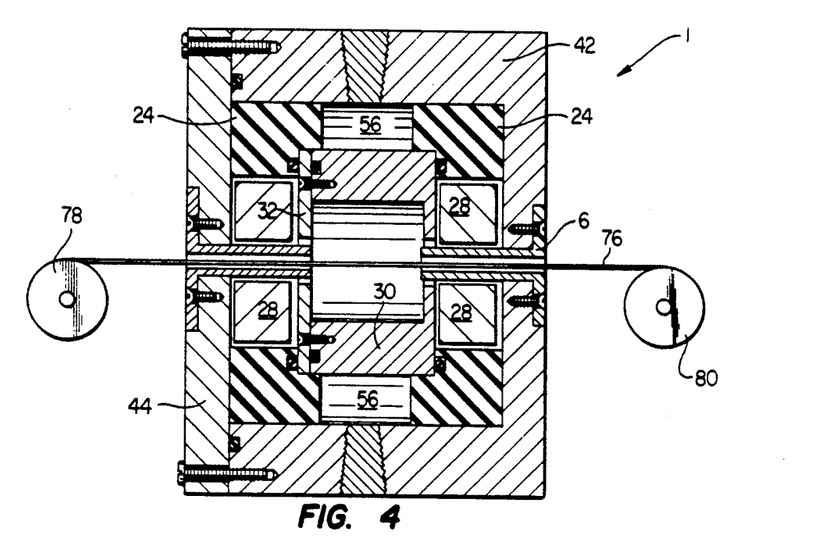
FIG. 4 is a cross-sectional view, partially schematic, of a sputtering system and substrate moving system according to the present invention.

Referring now to FIG. 4, it may be seen that the cylindrical hollow cathode magnetron of FIG. 3 has a structure that allows an elongate cylindrical substrate to be passed therethrough. In FIG. 4, the long cylindrical substrate is designated by reference numeral 76 and reference numerals 78 and 80 designate schematically represented substrate reel-out and substrate reel-in means. Thus, it should be appreciated that the structure of the cylindrical hollow cathode magnetron of the present invention is ideally suited for passing an elongate, cylindrical substrate therethrough.

Based upon the foregoing discussion, those skilled in the art should appreciate that the elements of the present invention described above constitute a superb solution to the shortcomings of the prior art relating to a lack of a mechanically simple means for uniformly coating an elongate cylindrical substrate. As shown in FIG. 4, as the substrate 76 is pulled at a constant rate through the axis of the cathode 4 all portions of the substrate 76 will be uniformly exposed to the sputtering process. Thus, it should be abundantly clear to those skilled in the art how easily a uniform coating may be deposited on a cylindrical substrate using the structure of the present invention heretofore described.

With respect to the operation of the various elements described above, those skilled in the art should readily appreciate that the cylindrical hollow cathode magnetron must be disposed in a vacuum chamber that is evacuated (to a pressure of, e.g., $10^{-5}$ to $10^{-6}$ torr) and then back-filled with one of any number of gases, e.g., argon. Those skilled in the art should further appreciate that when a high negative dc voltage (e.g., 300-1000 volts) power supply is connected to the cylindrical cathode 4, a glow discharge plasma is generated because of glow discharge phenomena within the hollow cavity of the cathode 4. The magnetic flux lines confine most of the plasma near the cathode. During the sputtering operation, energetic positive argon ions from the plasma (assuming an atmosphere of pure argon gas is employed in the system) are accelerated towards the negative potential of the cathode surface and hit it with high energy. Due to the momentum exchange which occurs as a result of the impact between the Ar+ ions and the surface of the cathode 4, atoms are ejected from the cathode material and these atoms coat the surface of any object disposed within the hollow cathode cavity.

If pure argon is used as the sputtering gas, a thin film of the same material as the target surface of the cathode is deposited on any object disposed within the hollow cathode cavity. In this matter, materials such as aluminum, YBCO, BiSrCaCO, copper, platinum, magnetic glasses, PVFD2, and Teflon can be deposited on the surface of fibers passed through the cathode. However, if another reactive gas such as $O_2$, $N_2$, $CO_2$, $CH_4$, or $NH_3$ is added to the chamber containing the sputtering apparatus in addition to argon, the reactive gas reacts with the sputtered metal atoms and forms compounds which are then deposited on the surface of a fiber being passed through the cylindrical hollow cathode magnetron (hereinafter, "CHCM") cavity. Sputtering materials such as AlN, ZnO, $LiNbO_3$, $Al_2O_3$, and $TiO_2$ can be fabricated using a properly chosen reactive gas in the chamber during sputtering along with a properly chosen cathode material.

CHCM systems according to the present invention may be operated with either dc voltage or high frequency alternating voltage. When using insulating cathode material, an rf voltage (typically 13.56 MHz) is used to avoid charging up the cathode. As is generally known to those skilled in the art, the application of an rf voltage causes a negative dc potential to develop on the cathode, which negative dc potential is often referred to as the "self bias voltage" which results in sputtering.

There are several ways in which the coating process may be controlled in a CHCM according to the teachings of the present invention. First, compound coatings which vary all the way from metallic to stoichiometric compounds may be obtained by changing the percentage of a reactive gas to the argon gas comprising the sputtering atmosphere. Second, the coating properties can be changed by varying the applied voltage and thus the energy of the ions. For example, increasing the energy of the ions produced improves the adhesion of the coating to the fiber. The coating process may also be controlled by varying the speed at which the cylindrical substrate is moved through the CHCM. In general, the slower the substrate is moved through the apparatus, the thicker the coating which is formed on the surface thereof.

Another parameter relevant to the operation of the sputtering system of the present invention is that of substrate temperature. As the substrate passes through the sputter module its temperature rises because of electron/ion bombardment as well as because of the condensation of deposited material onto its surface. When the substrate is, for example, a wire, the temperature of the wire can be controlled by changing the sputtering parameters which affect the rate of electron bombardment on the wire. This can be very easily and effectively accomplished by varying the magnetic field within the sputter module. Stated another way, by changing the magnetic field confinement efficiency, the temperature of a wire substrate can be varied over a wide range. Also, by increasing the pressure of the working gas forming the atmosphere around the sputtering apparatus the energy of the depositing material is decreased due to an increase in the number of gas phase collisions which results in a relatively lower wire temperature. As can be seen from the foregoing, the capability of modifying the temperature of a wire substrate can enhance the versatility of the present invention. For that reason, certain preferred embodiments of the present invention include heater coils as further discussed below.

Usually, wires and fibers and similar substrates are either electrically unbiased (i.e., electrically floating) or grounded. However, in certain cases, a small negative voltage (e.g., 25 to 500 volts) is applied to the substrate. By changing the voltage applied to a wire substrate, the energy of the gas ions from the plasma bombarding the wire can be changed. This technique is commonly referred to as "bias sputtering" and results in the production of several useful properties in thin films such as lower intrinsic stress, smaller grain sizes, improved mechanical properties and better microstructure. In embodiments of the present invention in which bias sputtering is to be employed in connection with metallic and electrically conductive wires the bias voltage may be applied by simply connecting a dc power supply directly to the wire. If the wire is not electrically conductive but an electrically conductive material is being deposited on the wire, a wire puller pinch roller (discussed below in connection with the description of FIG. 14) can be electrically charged so that the freshly deposited conductive thin film acts as a bias medium. In both of the above two cases, either dc or rf bias voltage may be applied.

Figure 5:
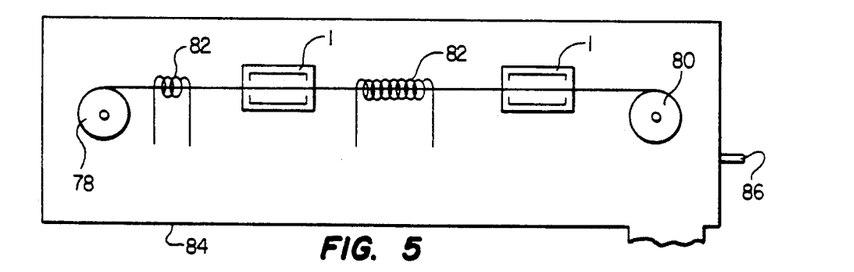
FIG. 5 is a schematic view of a configuration of an overall film deposition system according to the present invention.
Figure 6:
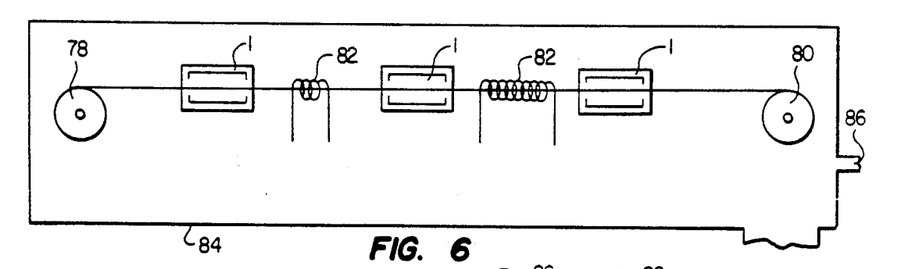
FIG. 6 is a second schematic view of a configuration of an overall film deposition system according to the present invention.
Figure 7:
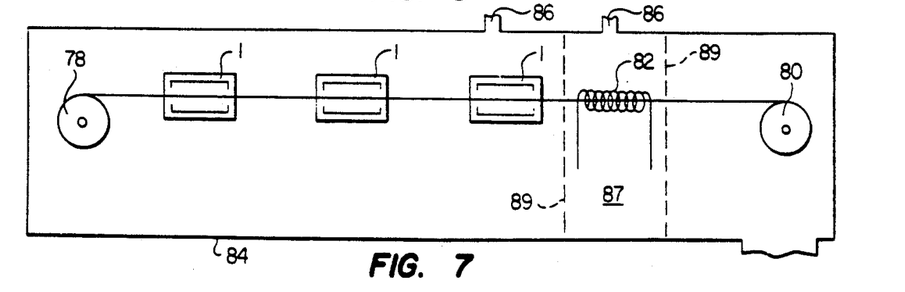
FIG. 7 is a third schematic view of a configuration of an overall film deposition system according to the present invention.

Referring now to FIGS. 5, 6 and 7, there are shown various embodiments of overall coating systems constructed in accordance with the system of the present invention. Each of the systems includes at least one CHCM 1 as well as at least one heating coil 82 (although it should be emphasized that embodiments of the present invention may not employ any heating coils) and wire moving means schematically indicated by the output and input reels, 78 and 80, respectively. The elements of each system are shown disposed in a vacuum chamber 84 which is evacuated and back-filled with a gaseous atmosphere as previously discussed. The system of FIG. 7 differs from the systems shown in FIGS. 5 and 6 in that a separate internal chamber 87 (signified by the dashed lines 89) is included so that annealing may be performed in a different gas and/or at a different pressure than deposition. This may be desirable in certain applications of the present invention. Internal walls or a complete internal chamber with small orifices therein to allow passage of the substrate or substrates therethrough can form a suitable internal chamber 87 in embodiments of the present invention. FIGS. 5, 6 and 7 show inlets 86 through which argon and/or some other gas may be introduced into the chambers 84 and/or 87. It should be noted that the heating of a substrate may take place before any deposition takes place as illustrated in the embodiment of FIG. 5. Alternatively, heating may take place only after all deposition has been completed as illustrated in the embodiment of FIG. 7 or intermediate the deposition of the various overlying layers as illustrated in the embodiment of FIG. 6.

All three of the illustrated embodiments shown in FIGS. 5, 6 and 7 include CHCM's placed in series so that the wire or other elongate cylindrical substrate passes through them sequentially, one after the other. The sputtering modules 1-1 may be placed in a single vacuum system, as illustrated in FIGS. 5-7 or in separate vacuum systems. In operation, such embodiments of the present invention containing a plurality of sequentially arranged modules 1-1 can deposit more than one layer of different materials on a wire. Each individual layer can serve different purposes, such as adhesion, conduction, and/or protection. The relative thicknesses of the various layers can be controlled by any of the various techniques discussed above, such as by varying the voltages applied to the different CHCM modules 1-1.

Figure 13:
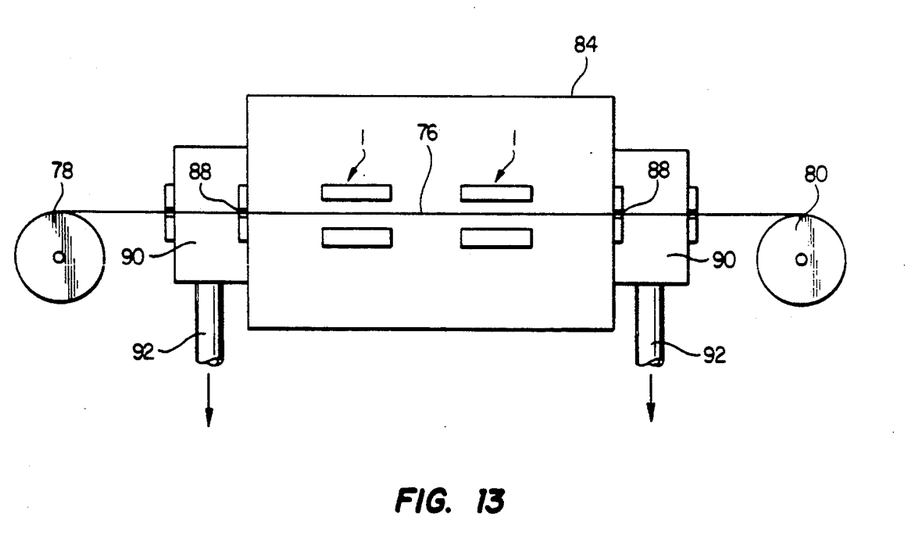
FIG. 13 is a schematic view of an overall film deposition system according to the teachings of the present invention.

Although the wire dispensing and take-up reels or spools 78, 80 are all shown as being disposed within a vacuum chamber 84 in FIGS. 5, 6, and 7, the wire dispensing and take-up spools may be placed outside such a chamber. FIG. 13 shows how this can be accomplished through the use of gas locking seals. First, the substrate being coated 76 is passed through very small orifices 88 in the wall of the chamber 84. Additionally, the orifices 88 are "in-line load-locked" by disposing load-lock chambers 90 between the orifices 88 and the ambient environment to minimize the risk of vacuum loss and/or air contamination. Load-lock chambers 90 are differentially pumped and/or purged (via conduits 92) with an appropriate gas.

It should be noted that there is no requirement that only a single wire be passed through a module at the same time in embodiments of the present invention. In the case of extremely small diameter wires, the shadowing effect due to the presence of adjacent wires upon one another is very small and a large number of wires can be coated uniformly at the same time. Because of this characteristic, as well as other characteristics of the present invention previously described, it should be readily apparent that the present invention is susceptible to being quickly and easily modified and/or properly scaled to coat cylindrical substrates in commercially practicable volumes.

Figure 14:
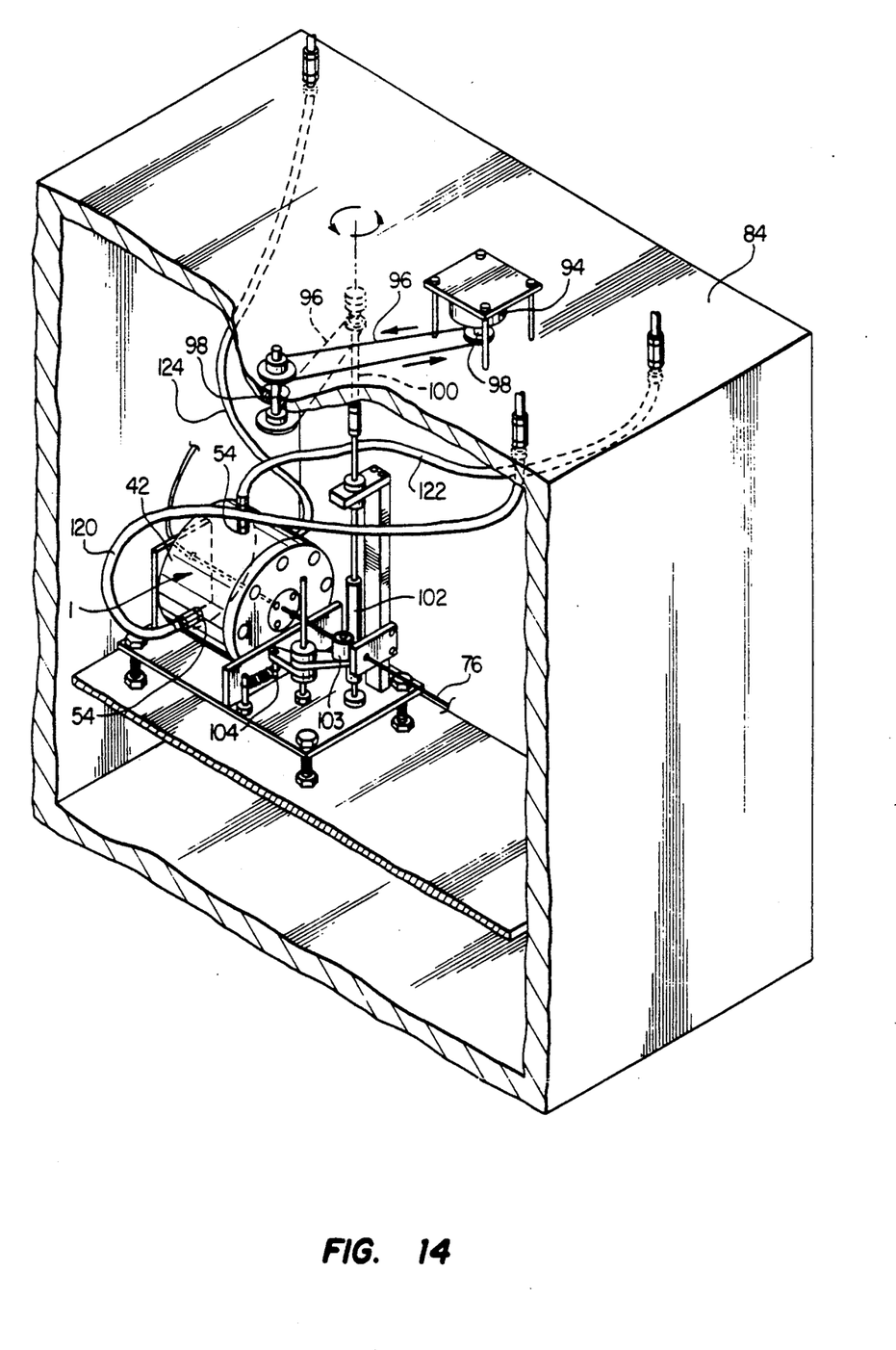
FIG. 14 is a cut away, perspective view of portions of an overall system according to the present invention.

Referring now to FIG. 14, shown therein are the details of a mechanical substrate moving system that has been constructed in accordance with the teachings of the present invention and found to work satisfactorily. This substrate moving system includes a small motor 94 mounted atop vacuum chamber 84. The rotary motion output shaft of motor 94 is transferred into linear motion and applied to substrate 76 by a pair of chains 96 that rotate sprockets mounted on a series of shafts 98, 100. Shaft 100 passes through a gas-tight seal from the outside to the inside of vacuum chamber 84 and shaft 100 is rotatably mounted within chamber 84 and connected to pinch roller 102. The substrate 76 is gripped between the driven pinch roller 102 and an idler pinch roller 103 which is spring biased toward the substrate by a mechanism 104. The two pinch rollers 102 and 103 effectively pull top wire 76 out of the CHCM 1. Of course, a multitude of other elongate substrate moving (and take-up spooling) means may be constructed. In view of the teachings of the present invention set forth herein, those skilled in the art should be readily able to construct any number of such systems.

Further with respect to FIG. 14, shown therein are how holes 54, discussed above in the discussion of FIG. 3, can be situated and used in embodiments of the present invention. In a preferred embodiment of the present invention, there are three such holes 54. One hole 54 is to allow coolant to be let into chamber 56, another hole 54 is to allow coolant to leave chamber 56, and the final hole 54 is to allow an electrical connection to be made to cathode 6. The coolant outlet hole 54 is generally positioned above the coolant inlet hole 54 so that coolant being pumped in forces the used coolant up and out of the sputtering system. In FIG. 14, tube 120 is connected to the coolant inlet hole 54, tube 122 is connected to the coolant outlet hole 54, and wire 124 leads to cathode 6 through yet another hole 54 (not shown).

Figure 8:
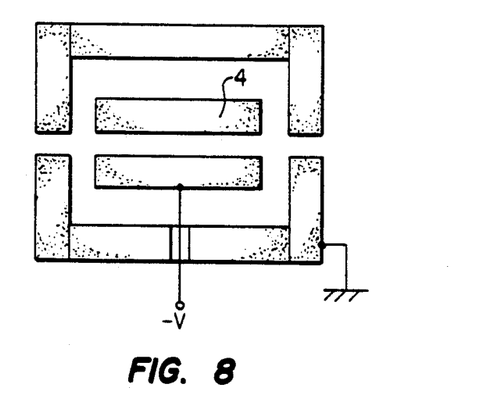
FIG. 8 is a schematic view of a sputtering source without any magnetic field imposed therein.

FIGS. 8, 9 and 10–12 illustrate certain important aspects of the present invention relating to the magnetic fields used to confine and enhance the plasma employed within the system. FIG. 8 shows a basic sputtering system which employs a cylindrical cathode 4 enclosed from the outside by plasma shields such that the plasma is generated inside the cathode. As previously discussed, any of a number of types of magnetic fields may be used to confine and enhance the plasma in the hollow cathode. Most effectively, the electric and magnetic fields are configured such that the E×B force on the electrons causes them to move into a path which closes on itself, resulting in entrapment of the electrons. A multitude of different effective magnetic fields may be employed, although only a few are described below.

Figure 9:
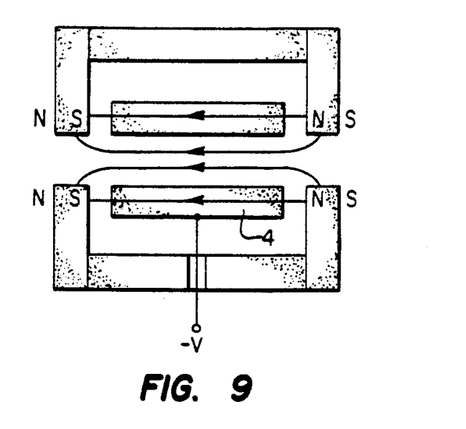
FIG. 9 is a schematic view of the source of FIG. 8 with a certain magnetic field therein.

Based on the E×B force principle, a number of plasma confinement configurations are possible which include axial magnetic fields, multipole fields, radial fields, monocusps, multicusps and highly divergent fields. Any one or a combination of these magnetic field configurations may be used to confine the plasma inside the hollow cathode 4. A magnetic confinement method based on axial magnetic field geometry is illustrated in FIG. 9 in which the electrical and magnetic fields are such that the electrons are trapped in cycloid orbits around the anode, thereby increasing the plasma density.

Figure 10:
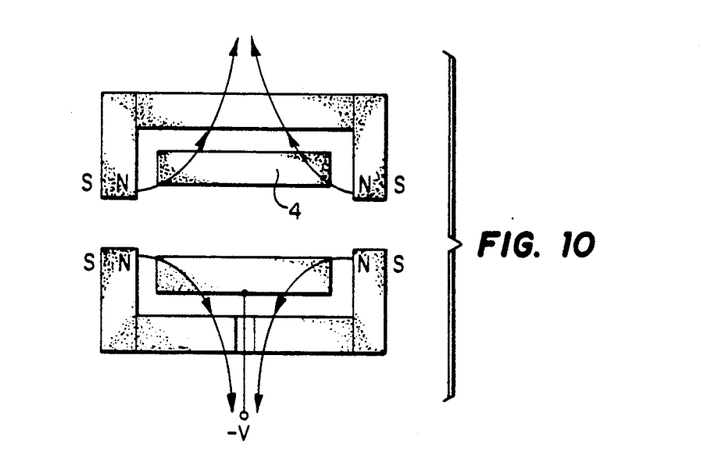
FIG. 10 is a schematic view of the source of FIG. 8 with a second certain magnetic field therein.

A cusped shaped magnetic field can also be used for confining the plasma in the middle of the cylindrical cathode, as illustrated in FIG. 10

Figure 11:
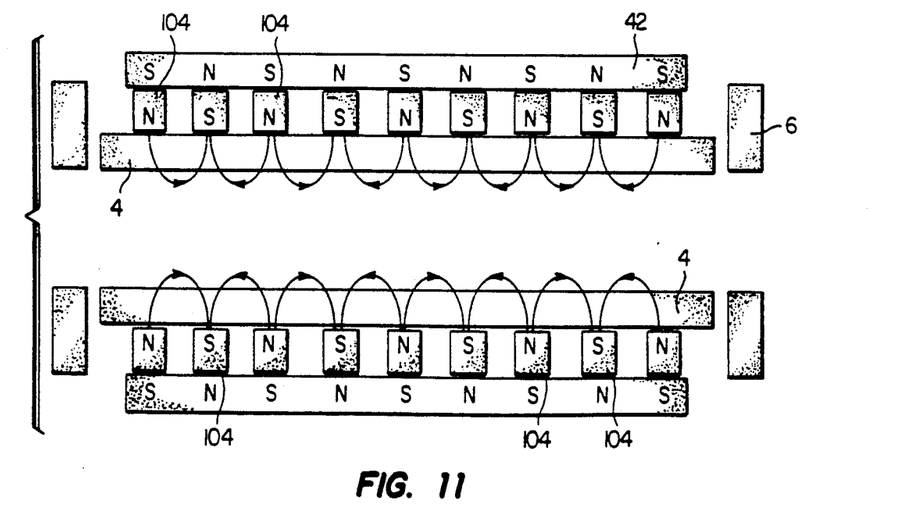
FIG. 11 is a schematic view of portions of a sputtering system according to the teachings of the present invention.

Another plasma confinement device based upon the multipole magnetic field configuration is illustrated in FIG. 11. A cylindrical cathode 4 is shown therein surrounded by a plurality of donut-shaped magnets of alternating polarity placed behind the cathode to create a magnetic field configuration which results in plasma confinement over a large range of plasma density. This type of magnetic field would be most preferred in embodiments of the present invention in which a very long hollow cathode is used to obtain a high throughput of coated wire passing through the system in a given period of time.

Figure 12:
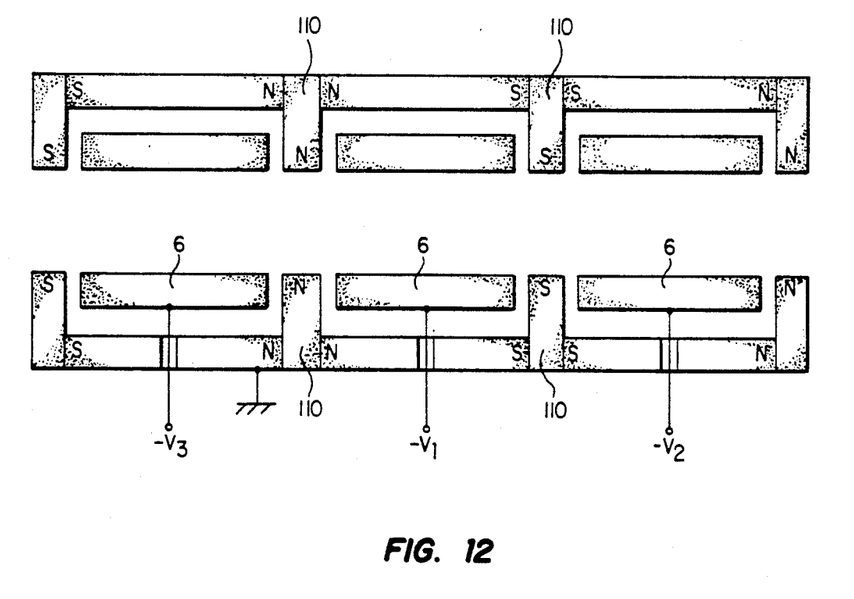
FIG. 12 is a schematic view of portions of a second sputtering system according to the teachings of the present invention.

FIG. 12 illustrates an embodiment of the present invention in which a plurality of cathodes 6 (three are shown in FIG. 12) are mechanically connected to one another so that magnetic pole-pieces 110 separate the cathodes Staged deposition can be effected with such an embodiment in which sputter rates can be controlled by applying different voltages to the various cathodes In addition to the advantages of the present invention described above which relate to the use of permanent magnets, it should also be appreciated that a wide variety of different magnetic field configurations can be obtained in various embodiments of the present invention. By using selected magnetic fields for particular applications, it is possible to operate the sputtering module or modules over a very wide pressure range, i.e., from about $10^{-5}$ to about $3 \times 10^{-1}$ torr, and greatly enhance the versatility of the present invention. In yet another aspect of the present invention, plasma confinement can be used to reduce the electron bombardment on a fiber being coated. This feature is particularly useful in connection with temperature sensitive substrate materials. For example, Teflon materials are polymers and deposition must be effected at a temperature below their glass temperature.

As should be well appreciated by those skilled in the relevant art, a big obstacle in construction of the cylindrical hollow cathode magnetron heretofore described is target fabrication. Forming tubes of such materials as aluminum is quite easy; however, forming tubes of other materials, such as the high temperature superconducting (HTS) oxide YBaCuO, is generally recognized as being so difficult as to be virtually impossible.

In response to the difficulty discussed in the immediately preceding paragraph and to facilitate construction of embodiments of the present invention, the description which follows, and accompanying drawings FIGS. 15 to 23, generally describe and depict a number of ways in which cylindrical hollow cathodes can be formed from HTS materials.

Figure 15:
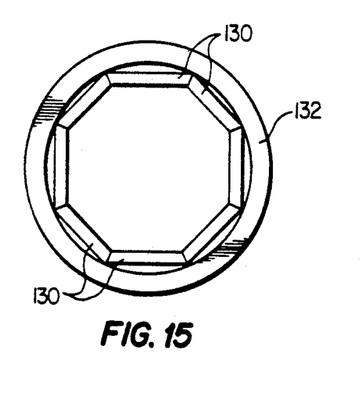
FIG. 15 is a top plan view of an embodiment of a cathode according to the teachings of the present invention.
Figure 16:
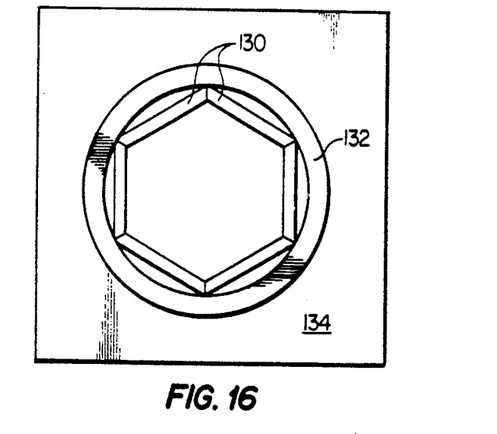
FIG. 16 is a view as per FIG. 15 of another embodiment of a cathode according to the teachings of the present invention, this FIG. also depicting a cooling means.
Figure 17:
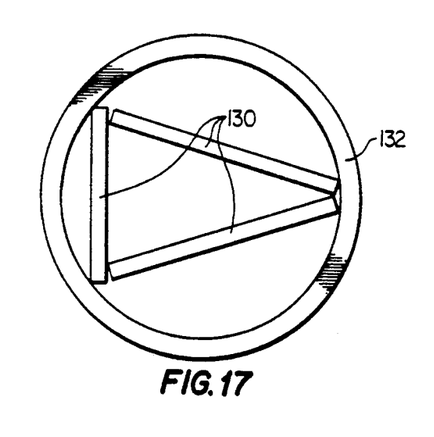
FIG. 17 is a view as per FIG. 15 of another embodiment of a cathode according to the teachings of the present invention.

Referring now specifically to FIG. 15, one solution to the target fabrication problem may be seen to involve strips of ceramic HTS material 130, which strips are bonded or soldered or otherwise attached to the inside of a hollow cathode backing plate 132. In FIG. 15 the strips are shown attached so as to have an octagonal cross-section. Other forms, such as the ones shown in FIGS. 16 and 17 (i.e., having hexagonal and triangular cross-sections respectively) are also possible. In preferred embodiments of the present invention having targets constructed by this method, the closer the internal cross-section is to a circle the better. However, any polygonal configuration, down to and including the configuration of FIG. 17, could provide sufficient or otherwise acceptable thin film uniformity in particular applications. The thin strip material could be any ceramic material (including YBaCuO) and the backing could be formed of copper or stainless steel or any other such material. As those skilled in the art should appreciate, attachment of the strips to the backing plate 132 may be facilitated at times if the backing plate 132 is cooled. To illustrate this and to indicate that such cooling may be employed in methods of constructing a system according to the teachings of the present invention, a cooling means, such as a refrigerated chamber 134, is shown schematically in FIG. 16.

Figure 18:
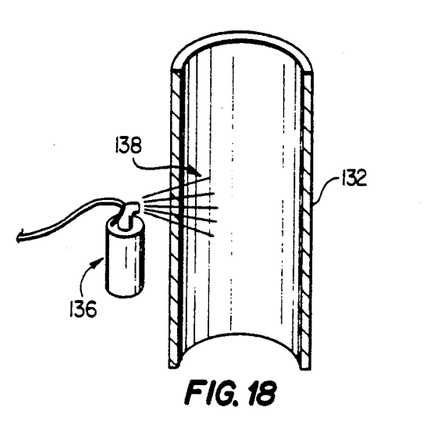
FIG. 18 is a cross-sectional view of a cathode according to the teachings of the present invention together with a spraying means used in its formation.
Figure 19:
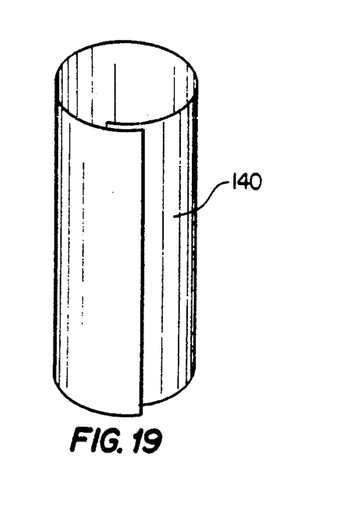
FIG. 19 is a perspective view of material that may be incorporated into embodiments of the present invention.

Referring now to FIG. 18, yet another solution to the target fabrication problem is generally depicted. This solution involves use of spraying means 136 to coat the inside of a hollow cathode 132 with a layer of HTS material 138. The structure and operation of such spraying means should be known or readily determinable by those skilled in the art. Many refinements of such spraying means have been and are presently being made by various employees of the assignee of the present invention.

Figure 20:
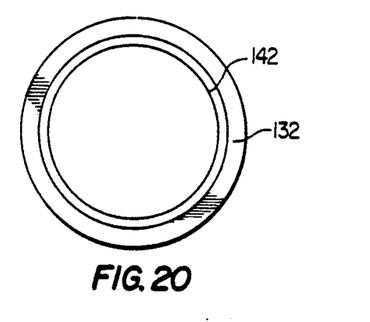
FIG. 20 is a top plan view of a cathode according to the teachings of the present invention.

Yet another solution to the target fabrication problem involves use of long rolled up strips of cathode material 140 (see FIG. 19) which can be bonded to the inside of a copper, stainless steel or similarly constituted cylinder. Related to such a solution is the process of machining HTS oxide material in the shape of a tube 142 and then epoxy bonding that tube to the inside of a cylinder 132. The final result of this latter process is generally illustrated in FIG. 20.

Figure 21:
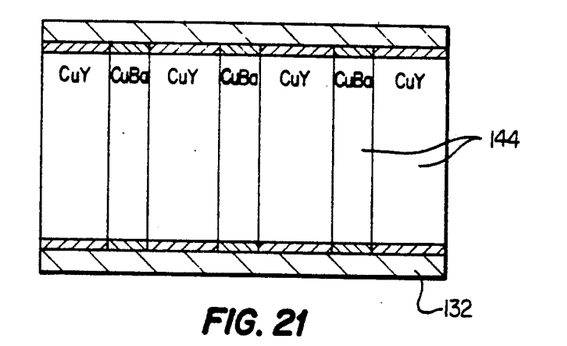
FIG. 21 is a cross-sectional view of a cathode according to the teachings of the present invention.

Yet another approach developed by the inventor of the present invention is depicted in FIG. 21. This approach involves using binary alloys of various HTS materials, such as CuY and CuBa for YBCO. Thin strips of the binary alloys 144 can be positioned adjacent to each other in an alternating fashion around a cylindrical axis, and bonded to the inside of a hollow cylinder 132. The composition and relative areas of the various strips could be adjusted experimentally to obtain films with desired elemental concentrations. Bi or Tl compounds or HTS compounds developed in the future could be fabricated using similar binary or even ternary alloys.

Figure 22:
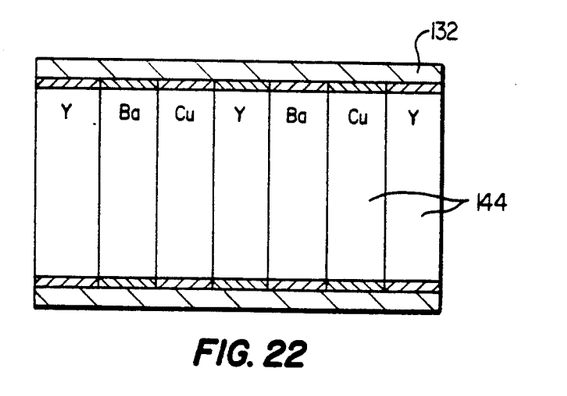
FIG. 22 is a cross-sectional view of another cathode according to the teachings of the present invention.
Figure 23:
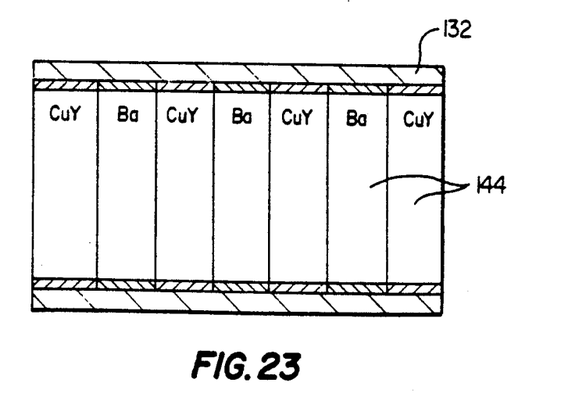
FIG. 23 is a cross-sectional view of yet another cathode according to the teachings of the present invention.

FIG. 22 illustrates a variation of the approach discussed immediately above. FIG. 22 depicts use of pure elements instead of binary alloys. Also, as shown in FIG. 23, it may be desirable for creation of films of certain materials to use a combination of alloys and pure metals. In each of these cases, the strips are attached to a cylinder of copper or similar such material by bonding or similar means.

It is thus believed that the operation and construction of the present invention will be apparent from the foregoing description. While the methods and apparatus shown and described have been characterized as being preferred it will be obvious that various changes and modifications may be made therein without departing from the spirit and scope of the invention.

What is claimed is:

1. A cathode for inclusion in a sputtering system, said cathode comprising:
a metallic outer cylinder and
lengthwise arrayed target material disposed within said metallic outer cylindrical in a closed polygonal cross-sectional shape within said metallic outer cylinder, said lengthwise arrayed target material able to be sputtered and to thereby form a film of high temperature superconducting material on a substrate positioned within said closed polygonal shape.

2. A cathode as recited in claim 1, wherein said lengthwise arrayed superconducting target material comprises strips of material.

3. A cathode as recited in claim 2, wherein said strips of material are arranged so as to form said polygonal cross-sectional shape.

4. A cathode as recited in claim 3, wherein said strips of material are arranged so as to have an octagonal cross-section.

5. A cathode as recited in claim 3, wherein said strips of material are arranged so as to have a hexagonal cross-section.

6. A cathode as recited in claim 2, wherein said strips of material comprise strips of alloys.

7. A cathode as recited in claim 2, wherein said strips of material comprise strips of pure elements.

8. A cathode as recited in claim 2, wherein said strips of material comprise strips of binary alloys.

9. A cathode as recited in claim 2, wherein said strips of material comprise strips of alloys and strips of pure elements.

10. A system for depositing a superconducting film on at least one substrate, said system comprising:
a sputtering system including a cathode comprising a metallic outer cylinder and lengthwise arrayed target material disposed within said metallic outer cylinder so as to form a closed, polygonal cross-sectional shape within said metallic outer cylinder; and
means for causing at least one substrate to move through said sputtering system.

11. A system as recited in claim 10, wherein said lengthwise arrayed target material disposed within said outer cylinder of said cathode comprises strips of material.

12. A system as recited in claim 11, wherein said strips of material are arranged so as to form said polygonal cross-sectional shape.

* * * * *